Nov. 5, 1974 D. J. DUMIN 3,846,194

PROCESS FOR PRODUCING LIGHTLY DOPED P AND N-TYPE REGIONS OF SILICON ON AN INSULATING SUBSTRATE

Filed Jan. 5, 1973 2 Sheets-Sheet 1

United States Patent Office 3,846,194

Patented Nov. 5, 1974

3,846,194

PROCESS FOR PRODUCING LIGHTLY DOPED P AND N-TYPE REGIONS OF SILICON ON AN INSULATING SUBSTRATE

David Joseph Dumin, Ringoes, N.J., assignor to Inselek Inc., Princeton, N.J.

Filed Jan. 5, 1973, Ser. No. 323,339

Int. Cl. H01l 7/36

U.S. Cl. 148—188 12 Claims

ABSTRACT OF THE DISCLOSURE

Disclosed herein is a method of producing lightly doped P and N-type regions of silicon on an insulating substrate, e.g., sapphire. The process enables one to produce P-type and N-type regions of the same thin, silicon films; the doping density of these P and N-type regions is very closely controlled so that complementary types of PMOS and NMOS transistors can be fabricated. The doping densities which can typically be obtained are, for example, $1 \times 10^{15}$ atoms of phosphorus per cubic centimeter for the N-type regions and $1 \times 10^{16}$ atoms of boron per cubic centimeter for the P-type regions.

This invention relates to the production of P and N-type regions of silicon on an insulating substrate and more particularly relates to the process for producing lightly doped P and N-type regions of silicon on an insulating substrate.

One may readily, using well-known technology, produce heavily doped P-type or N-type regions of silicon on lightly doped N-type or P-type silicon. It is, however, very difficult to produce lightly doped P-type and N-type silicon on the same sapphire substrate because the amount of impurities needed to convert lightly doped N-type silicon to P-type silicon, and vice versa, is very small. Certain selective deposition techniques have been attempted, and while they have been somewhat successful, these techniques are very expensive.

The processes known to the art involve, for example, depositing or growing a layer of N or P-type silicon on the insulating substrate such as sapphire. Thus an N-type layer of silicon having from $10^{14}$ to $10^{16}$ atoms of phosphorus per cubic centimeter of silicon can be formed on the substrate. A portion of the surface of the deposited layer can then be masked, for example, by photoresist and oxidation techniques. The masked and unmasked portions of the surface are then exposed to a source of impurities, e.g. an atmosphere containing boron, oxygen and perhaps other inerts. Thus, for example, the surface may be subjected to an atmosphere containing boron tribromide at a temperature from 1000° to 1200° C. for from 10 minutes to hours. While this process is effective for putting large concentrations of boron (or phosphorus, as the case may be) into the underlying layer one cannot effectively obtain a lightly doped silicon layer. The boron atoms are diffused into the unmasked surface and convert the N-type region to a heavily doped P-type region containing above $10^{18}$ atoms of boron per cubic centimeter of silicon. The mask, e.g., $SiO_2$, is then removed.

The atomic density of silicon is typically $5 \times 10^{22}$ atoms per cubic centimeter. By using the above described diffusion process, one can easily and accurately diffuse $10^{19}$ atoms of boron into each cubic centimeter of the silicon. However, one cannot accurately diffuse small amounts of boron into the silicon. Thus, it is relatively routine to obtain a ratio of approximately 1 part of dopant per 1000 parts of silicon, whereas for many purposes, one must obtain a ratio of in the order of 1 part of dopant for every million parts of silicon. For example, it is necessary to get these lightly doped adjacent regions for certain complementary devices. In some instances one needs to obtain a region that will have as little as 1 part of phosphorus per 10 million silicon atoms and perhaps an adjacent region might require a ratio in the order of 1 part of boron for 5 million silicon atoms.

The above described diffusion technique works well for producing adjacent heavily doped regions of P and N-type silicon on a sapphire substrate. This technique cannot, however, be used to produce lightly doped N and P-type adjacent regions because the number of atoms of boron (or phosphorus if the silicon initially grown on the substrate is of P-type) which are driven into the unmasked surface cannot be carefully controlled.

A simple and easily controllable technique has now been discovered. This technique permits one to produce adjacent regions of N and P-type silicon on sapphire having dopant densities in the range of from $1 \times 10^{14}$ to $1 \times 10^{16}$ atoms of impurity per cubic centimeter of silicon deposited on the substrate.

Thus, in accordance with one embodiment of this invention, an N-type silicon layer is grown or deposited on a sapphire substrate. Certain surface regions of the N-type layer are masked by known techniques, and then a layer of P-type silicon containing a carefully controlled amount of boron atoms is deposited, e.g., epitaxially, over the entire masked and unmasked portion of the surface. The layer which is grown over the unmasked portion, that is directly on the underlying layer of N-type silicon is a controlled source of P-type impurity. Thus, in contrast to the known process of exposing the underlying N-type region to a source of gaseous boron which cannot be easily controlled, the instant process utilizes a solid semiconductor layer which can be accurately and conveniently deposited with precisely the number of phosphorus or boron atoms, as the case may be, which is required to convert the underlying silicon layer to the opposite type. This is a simple and inexpensive technique for producing adjacent regions of P-type and N-type silicon films on an insulating substrate with the very low doping densities which are required for use in making certain complementary types of PMOS and NMOS devices.

Figure 1:
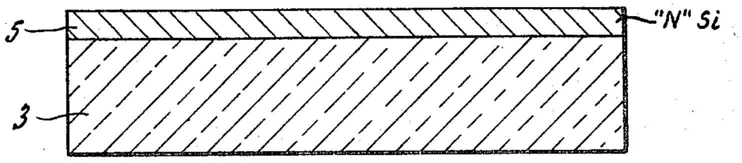
FIG. 1 is a side view of an insulating substrate 3 having a layer 5 of N-type silicon deposited thereon.
Figure 2:
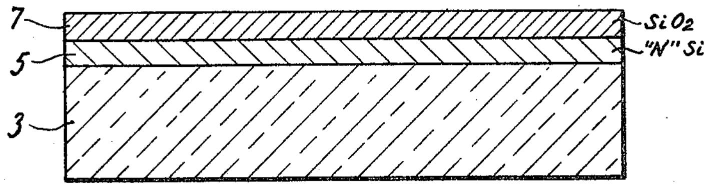
FIG. 2 illustrates the same view as FIG. 1 wherein a masking layer 7 of silicon dioxide is formed on the N-type silicon layer.
Figure 3:
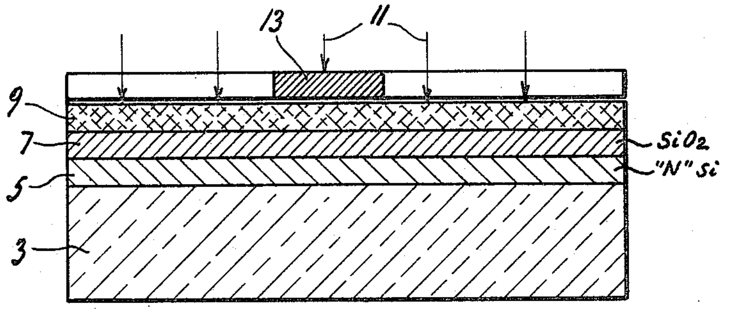

FIG. 3 is of the same view and illustrates the photoresist layer 9 being hardened by exposure to light rays 11 except in that area covered by mask 13.

Figure 4:
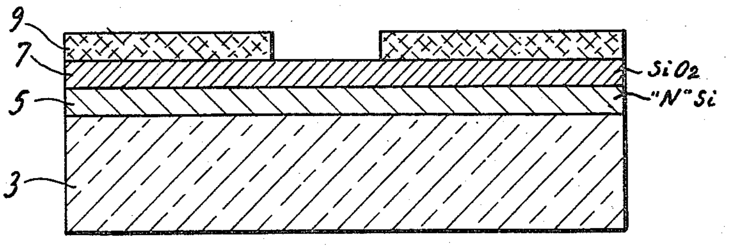

FIG. 4 is of the same view after the mask 13 and underlying section of photoresist have ben removed.

Figure 5:
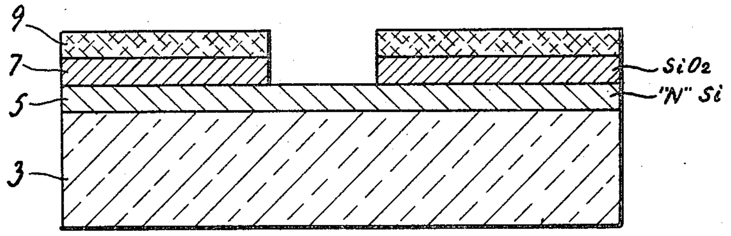

FIG. 5 is of the same view as FIGS. 1 through 4 and illustrates the system after a portion of the silicon dioxide layer 7 has been removed to expose a portion of N-type silicon layer 5.

Figure 6:
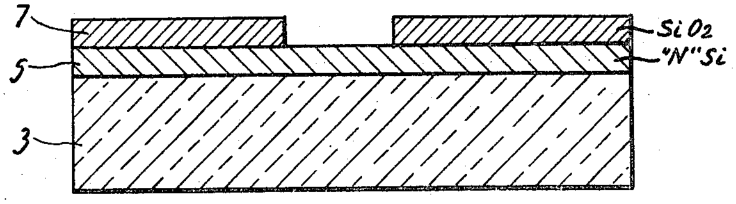

FIG. 6 is the same view after the photoresist 9 has been removed.

Figure 7:
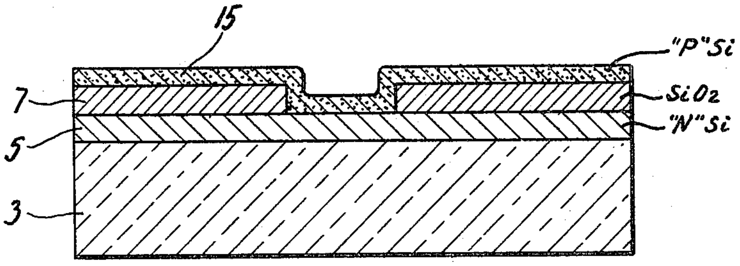

FIG. 7 is the same view after the layer 15 of P-type silicon has been grown.

Figure 8:
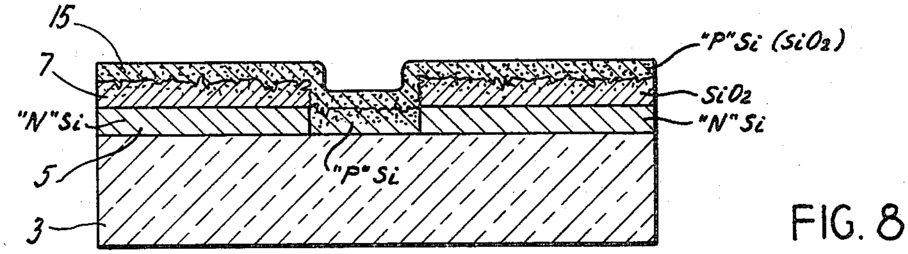

FIG. 8 is the same view and shows the P-type impurities, shown by the dots, being driven into the underlying N-type region.

Figure 9:
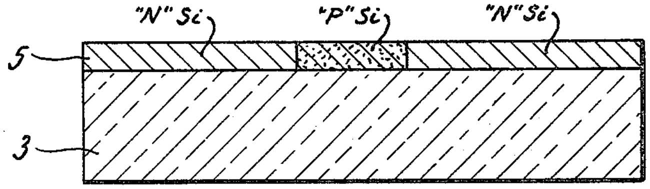

FIG. 9 is a side view of the completed product having lightly doped adjacent regions of N and P-type silicon on an underlying substrate.

The drawings illustrate the process wherein an N-type silicon layer is first deposited on the substrate and then a P-type region is created. This is just for purposes of illustration. One may just as easily first deposit the P-type region and later create an N-type region or regions.

In accordance with this invention, a layer of one type silicon is deposited on a substrate, a mask is then applied to the surface of those regions which are not to be doped by the opposite type impurity, a controlled source of the counterdopant, typically a 0.1 micron layer of P-type silicon with $10^{18}$ boron atoms per cubic centimeter, is deposited as a solid layer over the entire wafer or at least over the unmasked portions; and the counterdopant is driven into the first type silicon. Thus, for example, in order to produce the source of P-type impurities to counterdope portions of the N-type silicon layer, a very thin, highly-controlled epitaxial layer of doped silicon is used.

A preferred procedure is exemplified as follows. A layer of N-type silicon is deposited on the substrate. The regions which are not to be counterdoped are masked e.g., by heating in an oxidizing atmosphere to form a protective layer of silicon dioxide. The controlled source of counter dopant, for example, a 0.1 micron layer of P-type silicon with a concentration of $10^{18}$ boron atoms per cubic centimeter, is deposited over the entire wafer using $SiH_4$, $H_2$ and $B_2H_6$ mixtures at a temperature of from 950° to 1000° C. The P-type impurity is driven into the N-type silicon layer, which is typically 1 micron thick, by the use of high temperatures. The silicon layer, which is the controlled source of counterdopant, is then removed. This is done, for example, by oxidizing the layer to convert it to silicon dioxide. The wafer can then be dipped into hydrofluoric acid and all the silicon dioxide is removed. The wafer now contains adjacent regions of lightly doped N-type and P-type silicon. Complementary MOS procesing can be performed on the wafer.

The electrically insulating substrate 3, shown in the drawings, can be any crystalline alpha-aluminum oxide including ruby, alpha corundum and sapphire and is preferably a single crystalline alpha-aluminum oxide, most preferably a single crystalline sapphire.

The layer 5 of N-type silicon shown in the drawings (P-type silicon could be deposited first) can be grown or deposited by known techniques, e.g., epitaxial deposition. In accordance with this invention, it will contain from $1\times10^{14}$ to $1\times10^{16}$ atoms of P or N-type impurity per cubic centimeter of silicon layer. This layer is preferably a 1 micron single crystalline silicon layer which is grown by epitaxial techniques. Its thickness may, however, vary from 0.3 to 5 microns.

It is necessary to mask portions of the silicon layer 5 so that the doped silicon underlying the mask remains unchanged by the subsequently applied controlled source of counterdopant. A preferred method is illustrated in the drawings. A masking oxide is grown or deposited on the silicon layer. Thus, for example, the entire surface of the silicon layer 5 can be oxidized by subjecting it to an oxidizing atmosphere at a temperature of from 1000° C. to 1200° C. The resulting silicon dioxide layer is shown as item 7 in FIG. 2.

Holes are then opened in the masking oxide to expose those regions of the silicon layer 5 which are to be treated with a counterdopant. The holes can be opened by a variety of known methods. A preferred way to open the holes is to apply a photoresist on the entire silicon surface. Thhe photoresist layer 9 is shown in FIG. 3. Commercially available photoresists such as Kodak Thin Film Resist, Shipley Photoresist, and Waycoat IC Resist, are suitable.

As shown in FIG. 3, an opaque mask 13 is applied to a portion of the photoresist layer 9 prior to exposing the photoresist to light rays 11. The mask 13 is then removed and the photoresist which was not exposed to light is removed by treatment with a suitable developer. There are photoresists available which work in the opposite way.

Thus, in FIG. 4, the substrate 3 has the N-type silicon layer 5 deposited or grown thereon, which is protected by the silicon dioxide layer 7. The photoresists layer 9 is shown. The mask 13 in FIG. 3 has been removed. That portion of the silicon dioxide layer 7 which is not protected by the photoresist 9 is then etched away, for example, with hydrofluoric acid. Hydrofluoric acid is a preferred etchant. It will attack the silicon dioxide but will not attack the underlying layer 7 of doped silicon. Other suitable etchants include mixtures of water and hydrofluoric acid and mixtures of water, hydrofluoric acid and buffering agent.

FIG. 5 illustrates the product following the etching process. A portion of the silicon dioxide layer 7 has been removed, thereby exposing a region of the N-type silicon layer 5 which will be treated with a counterdopant.

The photoresist layer 9 is then removed. The layer can be removed in a variety of ways. A preferred method is to dissolve the photoresist layer in commercially available solvents such as Hunt Microstrip. The resutling product is shown in FIG. 6. Thus it is seen that the product described in FIG. 6 can be prepared by process steps which are known to the art. In accordance with the known processes, the product illustrated in FIG. 6 would be treated with a counterdopant by exposing the wafer to a gaseous atmosphere of boron tribromide at an elevated temperature. This process is effective for creating a heavily doped region, but not a lightly doped region.

In accordance with the process of this invention, a layer 15 of a controlled source of counterdopant is deposited on the surface of the wafer. This is preferably done by the epitaxial deposition of a doped silicon layer 15 over the entire surface of the silicon dioxide layer 7 and the exposed region of the doped N-type silicon layer 5. This is illustrated in FIG. 7. The layer of P-type silicon 15 which is deposited on the silicon dioxide is polycrystalline. The P-type silicon deposited over the exposed region of N-type silicon is single crystalline in the case where the N-type silicon layer is single crystalline.

By using an epitaxial deposition technique to form layer 15, one can precisely control the thickness of the layer 15 and the number of dopant (in the case shown, boron) atoms present in the deposited layer. The thickness of the layer should be in the range of from 0.03 to 0.3 microns, depending on the thickness of the underlying layer of N-type silicon. Thus, for a 1 micron layer of N-type silicon, one would typically deposit a 0.1 micron layer of P-type silicon. The required atomic density of P-type inpurities required in layer 15 can be easily calculated. The thickness of the layer 5 is known, thus the total volume of N-type silicon which is not protected by silicon dioxide layer 7 and will, therefore, be converted to a lightly doped P-type area can be calculated. The thickness of the controlled counterdopant layer 15 is known and the total volume of that layer 15 which is in direct contact with layer 5 is known. The P-type dopant which is in layer 15, is driven into layer 5 by heating the wafer to a temperature of from 1000° C. to 1200° C. for from 5 minutes to 10 hours. The boron atoms in the case shown are evenly distributed throughout the regions of layers 15 and 5 which are in contact with one another. Thus, the number of boron atoms that will diffuse into layer 5 can be easily calculated.

To go from the wafer shown in FIG. 7 to the completed product shown in FIG. 9, one must drive the boron atoms into the underlying layer 5 and then remove layer 15. This can be done as follows: one may apply heat in an inert atmosphere to the wafer shown in FIG. 7 and thereby drive the P-type impurity into layer 5; and layer 15 can then be removed by oxidizing the layer of silicon dioxide and removing the silicon dioxide with a suitable etchant such as hydrofluoric acid. Preferably, the two steps are performed together. The wafer shown in FIG. 7 is heated to a temperature of from 1,000° C. to 12,000° C. in an oxidizing atmosphere to produce the product shown in FIG. 8. In FIG. 8 layer 15 has been converted to silicon dioxide, and the P-type dopant which originally was in layer 15, is now equally distributed between layer 15 and layer 5. The final product is shown in FIG. 9.

In accordance with this invention, layer 15 of a semiconductor doped silicon is deposited. A doped silicon dioxide layer which would be an insulator is not suitable. The concentration of the dopant in layer 15 can be determined by measuring the electrical conductivity of the layer which is deposited.

Heat causes the dopant atoms which originally are present in layer 15 to migrate into layer 5, so that the adjacent portions of layers 15 and 5 end up with substantially the same concentration of dopant atoms. The concentration of dopant atoms required in layer 15 can be easily calculated by knowing the relative volumes of the adjacent portions.

The N and P-type silicon films are grown on the alpha aluminum insulatr, preferably on a ($\bar{1}\bar{1}02$) single crystalline sapphire. The invention is not dependant on the selection of a particular orientation. The films can be grown by known techniques, for example, by the pyrolysis of silane ($SiH_4$) in a vertical or horizontal chamber. P or N-type dopants in the form of diborane, phosphine, or arsine are introduced into the gas to provide suitably doped films. The concentration of the P or N-type dopant in the film is controlled by using flowmeters to control the ratio of phosphine or diborane to silane in the gas stream during growth. One may deposit either the P or N-type silicon first.

The temperature should be within the range of from 950° C. to 1050° C. and can be measured with an optical pyrometer focused on the substrate. The pyrometer temperature shoud be corrected for absorption and emissivity.

Thus, for example, a film can be grown as follows: A sapphire cut to ($\bar{1}\bar{1}02$) is placed in a epitaxial horizontal chamber. The chamber is flushed with a prefiring gas for 15 minutes. The sapphire substrate is then heated to prefiring temperature at a rate of 100° C. per minute. After prefiring, the substrate temperature was lowered at a rate of 100° C. per minute to the growth temperature, e.g. 1000° C. When the temperature is stabilized, the silane flow is started and continued until deposition is complete. The desired dopant is introduced into the gas stream containing the $SiH_4$ and $H_2$. For an N-type film either arsine or phosphine can be the dopant source, and for a P-type film, diborane can be used for the dopant source. After deposition is complete, the chamber is flushed with the suitable gas such as hydrogen to insure removal of the silane. Any post-firing may be done at this time or after subsequent low temperature measurements have been made. The substrate may be cooled at 100° C. per minute in a post-firing gas. Typical growth rates vary from 0.3 microns per minute to 3 microns per minute. Heating and cooling at a rate of from 100° C. to 200° C. per minute may be used to prevent thermal stress from cracking the substrate.

EXAMPLE I

A ($\bar{1}\bar{1}02$) sapphire is cut and mechanically polished to a scratch-free surface. An N-type silicon of (100) orientation is grown on the substrate by heating in a vertical chamber the substrate to a temperature of 1000° C. in the presence of silane containing phosphine as an N-type dopant. A film 1 micron thick is grown at a growth rate of approximately 1.0 microns per minute. A protective layer of silicon dioxide is then grown on the N-type silicon layer by heating the entire wafer at a temperature of 1000° C. in the presence of oxygen. A photoresist, Waycoat IC resist, is then applied to the surface of the silicon dioxide and those portions covering the regions which are to remain N-type silicon are exposed to light. The unexposed portion is removed by dissolving the unexposed photoresist in Hunt Microstrip. The silicon dioxide underlying the unexposed photoresist is then etched away with hydrofluoric acid at room temperature and the remaining photoresist is removed by dissolution in a mixture of $H_2O_2$ and $H_2SO_4$, ratio of 1:1.

A controlled source of counterdopant is then deposited by epitaxially growing a 0.1 micron thick layer of P-type silicon on the surface of the silicon dioxide and the exposed surface of the N-type silicon. This is performed in a chamber by heating the entire wafer to 1000° C. and exposing the entire surface to silane and a carefully controlled amount of diborane. The resulting layer has boron atoms present in the concentration of $10^{18}$ atoms per cubic centimeter.

The entire system is then heated in the presence of oxygen to a temperature of 1100° C. for 20 minutes. The P-type dopant in the second layer diffuses into the underlying layer of N-type silicon. The entire surface of P-type silicon in the controlled counterdopant is oxidized to silicon dioxide which is then removed together with the first layer of silicon dioxide by etching with hydrofluoric acid at room temperature.

EXAMPLE II

A ($\bar{1}\bar{1}02$) sapphire is cut and mechanically polished to a scratch-free surface. A P-type silicon of (100) orientation is grown on the substrate by heating in a horizontal chamber the substrate to a temperature of 1050° C. in the presence of silane containing diborane as a P-type dopant. A film one micron thick is grown at a rate of approximately 1.0 micron per minute. A protective layer of silicone dioxide is then grown on the P-type silicon layer by heating the entire wafer at a temperature of 950° C. in the presence of oxygen. A photoresist is then applied to the surface of the silicon dioxide and those portions covering the regions which are to remain P-type silicon are exposed to light. The unexposed portion is removed by dissolving the photoresist. The silicon dioxide underlying the unexposed photoresist is then etched away with hydrofluoric acid at room temperature and the remaining photoresist is removed by dissolving in a solution of hydrogen peroxide and sulfuric acid (1:1 molar ratio).

A controlled source of N-type counterdopant is then deposited by epitaxially growing a 0.1 micron layer of N-type silicon on the surface of the silicon dioxide and the exposed surface of the P-type silicon. This is performed in a chamber by heating the entire wafer to 1050° C. and exposing the entire surface to a gaseous mixture of silane and phosphine. The resulting layer has phosphorus atoms present in a concentration of $10^{18}$ atoms per cubic centimeter. The entire system is then heated to a temperature of 1100° C. for twenty minutes. The N-type dopant in the second layer diffuses into the underlying layer of P-type silicon. The wafer is then exposed to an oxidizing atmosphere to convert the second silicon layer to silicon dioxide which then together with the first layer of silicon dioxide is removed by etching with hydrofluoric acid at room temperature.

Although the process has been illustrated by describing a method for forming lightly doped regions of N and P-type conductivity in the same silicon layer, it can also be used to form adjacent N-type regions of different concentration. Thus, for example, an N-type region containing $10^{14}$ atoms of N-type dopant per cubic centimeter and an adjacent N-type region containing from $10^{15}$ to $10^{16}$ atoms of N-type dopant per cubic centimeter can be formed. The same is true for different concentrations of P-type dopant.

The wafers described herein can be made into transistors by forming metal electrodes by known processes; for example, as illustrated in an article entitled "Silicon-on-Sapphire Substrates Overcome MOS Limitations" appearing in *Electronics,* September 1972; the disclosure in said article being incorporated herein by reference.

The invention has been described with particularity. Various modifications can be made without departing from the use of the inventive process.

What is claimed is:

1. A method of producing lightly doped P and N-type regions of silicon on and insulating substrate comprising forming a layer of first type silicon on an insulating substrate, masking a portion of the surface of said layer, forming a layer of second type silicon containing a controlled amount of counterdopant on at least the unmasked portions of said layer of first type silicon, and heating the silicon layers to a temperature and for a time sufficient to drive a portion of the counterdopant into the unmasked region of the layer of first type silicon whereby a wafer is produced which has lightly doped regions of P conductivity and N conductivity and it can be used to make complementary types of PMOS and NMOS transistors.

2. A method according to Claim 1 wherein said insulating substrate is an alpha-aluminum oxide.

3. A method according to Claim 1 wherein said masking is performed by oxidizing a portion of the surface of said first layer to form silicon dioxide.

4. A method of producing P and N-type regions of silicon on an insulating substrate comprising epitaxially growing a first layer of single crystalline silicon containing a dopant upon a substrate of single crystalline alpha-aluminum oxide; oxidizing said silicon layer to form a protective layer of silicon dioxide; removing a portion of the silicon dioxide to expose a region of said first layer of single crystalline silicon; epitaxially depositing a second layer of silicon containing a counterdopant on the exposed region of said first layer of single crystalline silicon; heating the silicon layers to drive the counterdopant into the exposed region of said first layer; oxidizing said second layer of silicon and etching away all of the silicon dioxide.

5. A method according to Claim 4 wherein said dopant is boron and is present in said first layer of single crystalline silicon in a range of from $10^{14}$ to $10^{16}$ atoms per cubic centimeter of the silicon layer.

6. A method according to Claim 4 wherein said alpha-aluminum oxide is a single crystalline sapphire.

7. A method according to Claim 4 wherein said counterdopant is phosphorus and is present in said second layer of silicon in an amount of from $10^{15}$ to $10^{19}$ atoms per cubic centimeter of the layer.

8. A method of producing P and N-type regions of silicon on an insulating substrate comprising epitaxially growing a layer of N-type single crystalline silicon on a substrate of single crystalline alpha aluminum oxide; oxidizing said silicon layer to form a silicon dioxide surface; removing a portion of the silicon dioxide to expose a region of said N-type silicon layer; epitaxially depositing a layer of P-type silicon on said exposed region; heating the silicon layers to convert the unprotected regions of N-type silicon to a P-type region; and removing said silicon dioxide layer and said layer of P-type silicon.

9. A method according to Claim 8 wherein said layer of N-type silicon contains phosphorus in a concentration of from $10^{14}$ to $10^{16}$ atoms per cubic centimeter.

10. A method according to Claim 8 wherein said P-type layer contains boron atoms in a concentration of from $10^{15}$ to $10^{19}$ atoms per cubic centimeter.

11. A method for producing lightly doped P-type regions of different concentration in a layer of silicon on an insulating substrate comprising epitaxially depositing a first layer of P-type single crystalline silicon on a substrate of a single crystalline alpha aluminum oxide; oxidizing said silicon layer to form a silicon dioxide surface; removing a portion of the silicon dioxide to expose a region of said P-type silicon layer; epitaxially depositing a second layer of P-type silicon on said exposed region, said layer of P-type silicon containing a sufficient quantity of P-type dopant atoms to convert the underlying regions of P-type silicon to a P-type region having a greater concentration of P-type dopant; heating the silicon layers to drive P-type dopant atoms from said second layer into the unprotected regions of said first layer of P-type silicon; and removing said silicon dioxide layer and said second layer of P-type silicon.

12. A method for producing lightly doped N-type regions of different concentration in a layer of silicon on an insulating substrate comprising epitaxially depositing a first layer of N-type single crystalline silicon on a substrate of a single crystalline alpha aluminum oxide; oxidizing said silicon layer to form a silicon dioxide surface; removing a portion of the silicon dioxide to expose a region of said N-type silicon layer; epitaxially depositing a second layer of N-type silicon on said exposed region, said layer of N-type silicon containing a sufficient quantity of N-type dopant atoms to convert the underlying regions of N-type silicon to an N-type region having a greater concentration of N-type dopant; heating the silicon layers to drive N-type dopant atoms from said second layer into the unprotected regions of said first layer of N-type silicon; and removing said silicon dioxide layer and said second layer of N-type silicon.

References Cited

UNITED STATES PATENTS

| | | | |
|---|---|---|---|
| 3,413,145 | 11/1968 | Robinson et al. | 148—175 X |
| 3,476,617 | 11/1969 | Robinson | 148—175 |
| 3,496,037 | 2/1970 | Jackson et al. | 148—175 |
| 3,502,517 | 3/1970 | Sussmann | 148—188 X |
| 3,558,374 | 1/1971 | Boss et al. | 148—175 X |
| 3,609,477 | 9/1971 | Drangeid et al. | 148—187 X |
| 3,719,535 | 3/1973 | Zoroglu | 148—187 |
| 3,745,072 | 7/1973 | Scott | 148—175 |
| 3,749,614 | 7/1973 | Boleky et al. | 148—188 |

GEORGE T. OZAKI, Primary Examiner

U.S. Cl. X.R.

148—175, 187